(12) United States Patent
Bazes

(10) Patent No.: US 6,617,911 B2
(45) Date of Patent: Sep. 9, 2003

(54) REDUCING OUTPUT CAPACITANCE OF DIGITAL-TO-TIME DOMAIN CONVERTER FOR VERY HIGH FREQUENCY DIGITAL WAVEFORM SYNTHESIS

(75) Inventor: Mel Bazes, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/045,569

(22) Filed: Oct. 19, 2001

(65) Prior Publication Data
US 2003/0076152 A1 Apr. 24, 2003

(51) Int. Cl.[7] .............. H03K 17/62; H03K 17/693; H03K 17/735; H03K 17/76
(52) U.S. Cl. .............. 327/407; 327/408; 327/389; 327/391
(58) Field of Search ................ 327/407, 408, 327/391, 389, 394, 395, 396, 392, 399, 400

(56) References Cited
U.S. PATENT DOCUMENTS

| 4,496,861 A |   | 1/1985 | Bazes | 327/146 |
|---|---|---|---|---|
| 4,599,522 A | * | 7/1986 | Matsuo et al. | 327/382 |
| 4,777,385 A | * | 10/1988 | Hartmeier | 327/407 |
| 4,975,605 A |   | 12/1990 | Bazes | 327/161 |
| 4,980,585 A |   | 12/1990 | Bazes | 327/106 |
| 4,994,695 A |   | 2/1991 | Bazes | 327/161 |
| 5,036,230 A | * | 7/1991 | Bazes | 327/107 |
| 5,365,128 A |   | 11/1994 | Bazes | 327/141 |
| 5,581,207 A |   | 12/1996 | Bazes | 327/261 |
| 5,982,220 A | * | 11/1999 | Kim | 327/408 |
| 6,025,747 A | * | 2/2000 | Okayasu et al. | 327/407 |
| 6,157,222 A | * | 12/2000 | Yaklin | 327/81 |

\* cited by examiner

Primary Examiner—Tuan T. Lam
(74) Attorney, Agent, or Firm—Blakely, Sokoloff, Taylor & Zafman LLP

(57) ABSTRACT

In one embodiment, N transmission gates having N outputs transfer one of N pattern inputs to a first output based on an active signal from N select signals. The N outputs are connected together to form the first output and has an output capacitance. An amplifier circuit having a gain is coupled to the N transmission gates at the first output to reduce the output capacitance by an amount approximately equal to the gain. The amplifier circuit generates an output signal.

33 Claims, 5 Drawing Sheets

REDUCING OUTPUT CAPACITANCE OF DIGITAL-TO-TIME DOMAIN CONVERTER FOR VERY HIGH FREQUENCY DIGITAL WAVEFORM SYNTHESIS

BACKGROUND

1. Field of the Invention

This invention relates to digital waveform synthesis. In particular, the invention relates to digital-to-time-domain conversion.

2. Description of Related Art

There are many factors affecting the operating frequency of digital circuits. These factors include environmental conditions (e.g., supply voltage and temperature) and electrical characteristics of the devices implementing the digital circuits. Among these factors, parasitic capacitance is a significant factor that may reduce the switching frequency.

In many applications, it is useful to synthesize digital waveforms according to some predefined pattern. It is desirable to be able to synthesize the digital waveforms at frequencies as high as possible. The digital-to-time-domain converter (DTC) is a basic building block used in digital waveform synthesis (DWS). The DTC performance is limited by the large parasitic capacitance that is inherently present on its output node. This parasitic capacitance places a limit on the highest frequency that can be synthesized using DWS.

Therefore, there is a need to have an efficient technique to reduce the output capacitance in the DTC.

BRIEF DESCRIPTION OF THE DRAWINGS

The features and advantages of the present invention will become apparent from the following detailed description of the present invention in which.

DESCRIPTION

The present invention is a technique to reduce the output capacitance at the digital-to-time domain converter (DTC) used in digital waveform systhesis (DWS). The present invention includes use of an amplifier circuit at the output of the DTC. The amplifier circuit includes an amplifier having a gain and a feedback resistor. The output capacitance is reduced by an amount approximately equal to the gain of the amplifier. The amplifier can be implemented by an inverter and the feedback resistor can be implemented by a transmission gate circuit having an n-device and a p-device connected in the ON state.

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
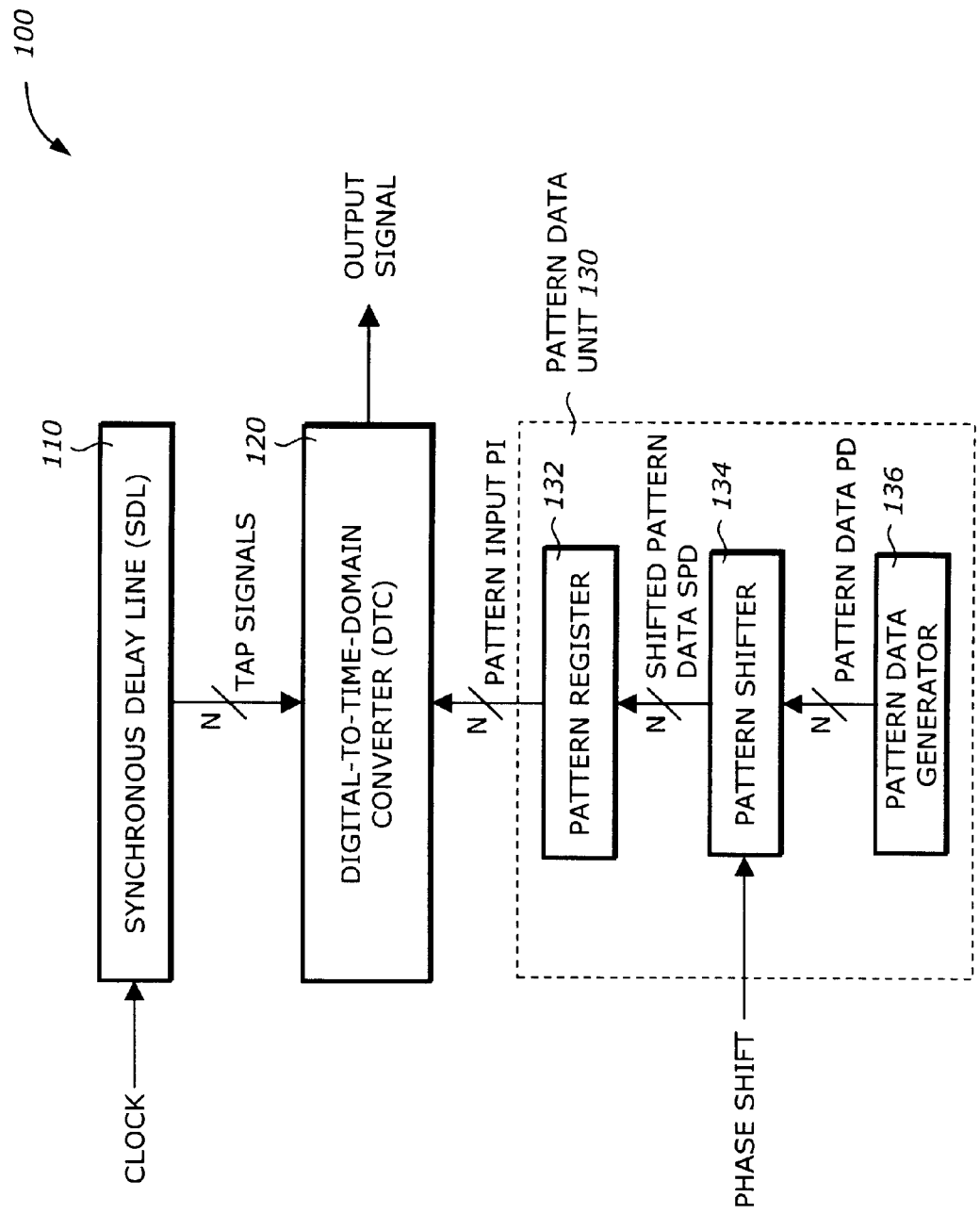
FIG. 1 is a diagram illustrating a system in which one embodiment of the invention can be practiced.

FIG. 1 is a diagram illustrating a system 100 in which one embodiment of the invention can be practiced. The system 100 includes a synchronous delay line (SDL) 110, a digital-to-time domain converter (DTC) 120, and a pattern data unit 130.

The SDL 110 receives a clock signal and generates N tap signals, or timing pulses, staggered at $T_p/N$ intervals, where $T_p$ is the clock period. It should be noted that the use of the SDL 110 is merely one method to generate the tap signals to meet the timing requirements for the DWS. Any other method that provides similar tap signals can be used. Examples of these methods include delayed-lock loop (DLL) and phase-locked loop (PLL) methods. The DTC 120 combines the SDL tap signals with a pattern input to synthesize an output waveform one bit every $T_p/N$ interval. The pattern data unit 130 provides the input pattern to the DTC 120. The pattern data unit 130 includes a pattern register 132, a pattern shifter 134, and a pattern data generator 136.

The pattern data generator 136 generates new N-bit pattern data for synthesis in each clock cycle. The pattern shifter 134 introduces a phase shift into the synthesized wave by shifting the pattern data by a number of bits that is proportional to the amount of phase shift. The resolution of the introduced phase shift is $T_p/N$. A left shift corresponds to a negative phase shift and a right shift corresponds to a positive phase shift. Let K be the number of bits to be shifted. Let α be the amount of phase shift. The amount of phase shift is, then, given by:

$$\alpha = \frac{K * 360°}{N} \qquad (1)$$

Figure 3:
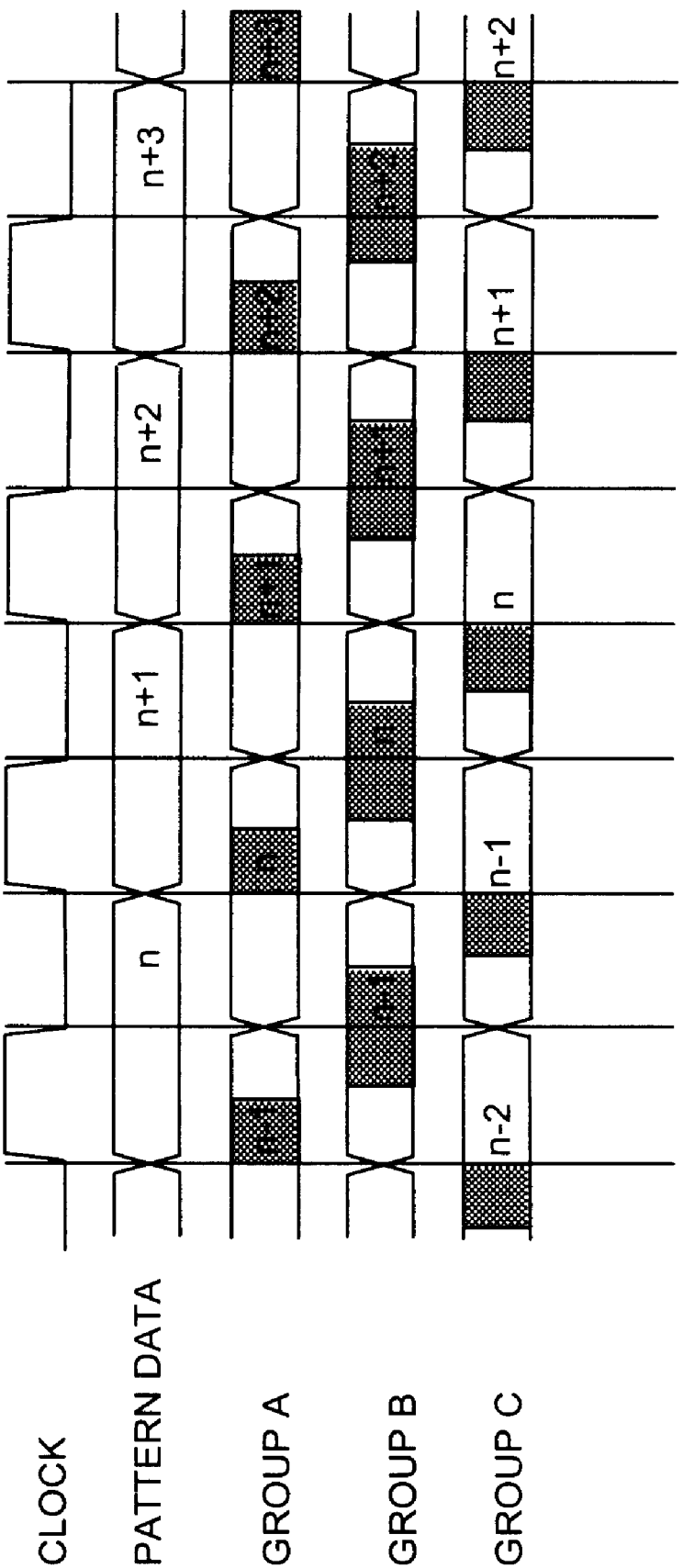
FIG. 3 is a timing diagram illustrating waveforms of the pattern inputs shown in FIG. 1 according to one embodiment of the invention.

The pattern register 132 stores the shifted pattern data from the pattern shifter 134. The pattern register 132 updates the pattern data presented to the DTC 120 with proper set-up and hold times for sampling by the tap signals from the SDL 110. The pattern to be synthesized, in general, changes in each clock, either by being replaced by a new pattern data from the pattern data generator 136, or by being shifted by the pattern shifter 134, or by both. When the pattern changes, it is invalid during the first portion of the reference clock period and may be sampled incorrectly by the tap signals from the SDL 110. To overcome this difficulty, a delay scheme is used by the pattern register 132. This delay scheme is illustrated in FIG. 3 and will be described later.

Figure 2:
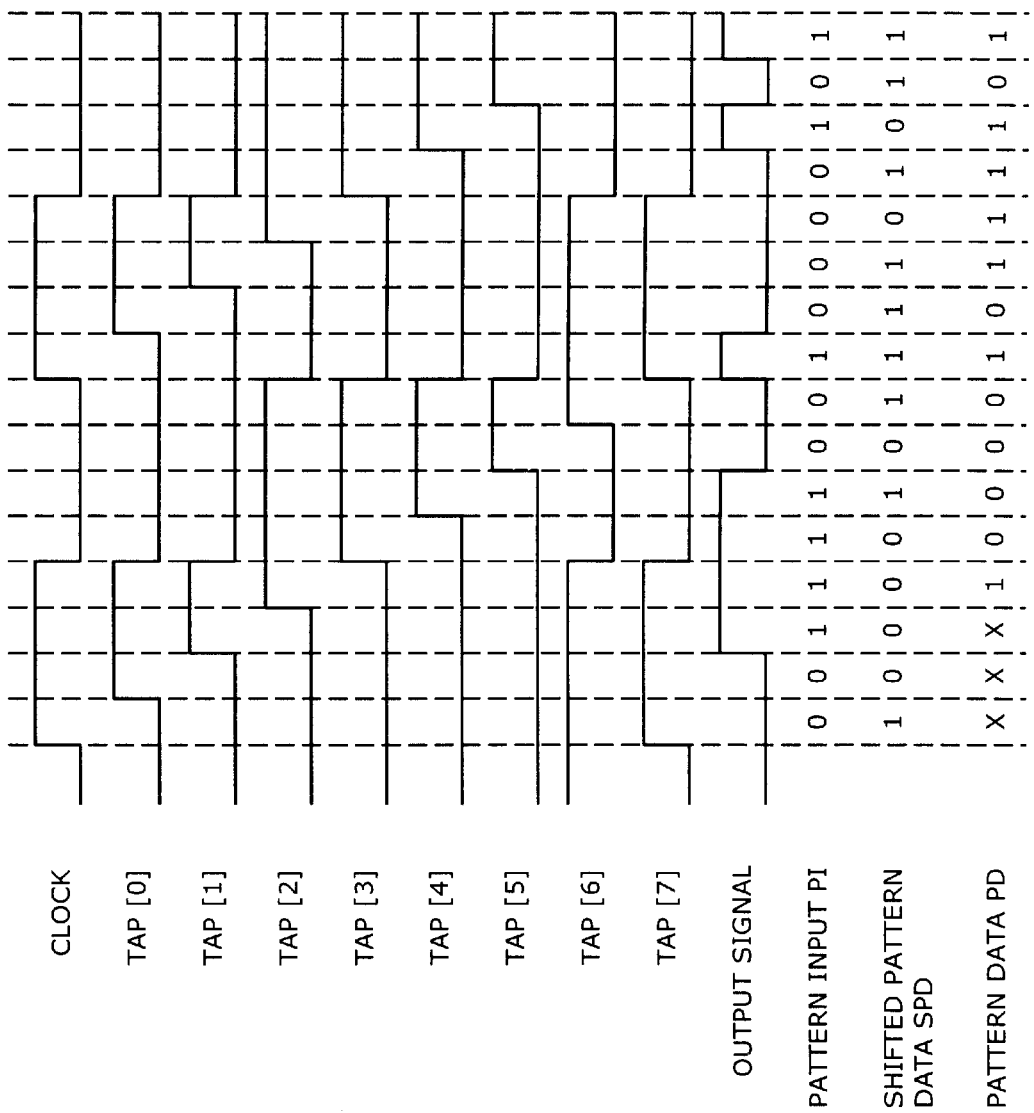
FIG. 2 is a timing diagram illustrating waveforms of the signals shown in FIG. 1 according to one embodiment of the invention.

FIG. 2 is a timing diagram illustrating waveforms of the signals shown in FIG. 1 according to one embodiment of the invention. The signals include the reference clock signal CLK, the tap signals TAP[0:N−1] from the SDL 110, the synchronized pattern input PI[0:N−1] from the pattern register 132, the shifted pattern data from the pattern shifter SPD[0:N−1] 134, and the original pattern data PD[0:N−1] from the pattern data generator 136.

In this illustrative example, the number of bits N for the pattern data is 8. There are 8 corresponding tap signals from the SDL 110, TAP[0] to TAP[7]. It is noted that the tap signals are divided into three groups. The first group, group A in FIG. 3, corresponds to the first N/4 tap signals, i.e., TAP[0:1]. The second group, group B in FIG. 3, corresponds to the middle N/2 tap signals, i.e., TAP[2:5]. The third group, group C in FIG. 3, corresponds to the last N/4 tap signals, i.e., TAP[6:7]. The tap signals in the first and the third groups are de-asserted in the middle of the clock period. The tap signals in the middle group are de-asserted at the start of the clock period. By de-asserting the tap signals of the first and third group in the middle of the clock period, solid low and high times can be achieved, as will be shown later. It should be noted that the boundaries between the three groups are a design choice. In other embodiments, the number of groups and the groupings may be changed. As seen in FIG. 3, the tap signals TAP[0:7] are asserted synchronously with the corresponding pattern input PI[0:7] so that reliable data clocking can be achieved.

The pattern data PD[0:7] changes every clock. In the example illustrated in FIG. 2, the pattern shifter 134 introduces a 3-bit left shift corresponding to a phase shift of −135°. The pattern register 132 delays the shifted pattern data SPD[0:7] by one clock to provide the pattern input PI[0:7]. The pattern input bits are then sampled by the tap signals TAP[0] to TAP[7] to generate the output signal as a synthesized waveform.

FIG. 3 is a timing diagram illustrating waveforms of the pattern inputs shown in FIG. 1 according to one embodiment of the invention. The pattern input bits PI[0:7] are provided by the pattern data generator 136, shifted (if necessary) by the pattern shifter 134, and synchronized by the pattern register 132.

The pattern input bits are delayed by the pattern register 132 in three groups: A, B, and C. Group A includes the lower N/4 bits, i.e., PI[0:1]. Group B includes the middle N/2 bits, i.e., PI[2:5]. Group C includes the upper N/4 bits, i.e., PI[6:7]. The inputs in group A are delayed by one half a clock period so that they have nominally one half a clock period to stabilize, i.e., they have one half a clock period of setup time, before being sampled by the lower N/4 tap signals TAP[0:1] as illustrated in FIG. 3. Also, as illustrated in FIG. 3, the inputs in group A nominally have a hold time of one fourth a clock period from tap signals TAP[0:1]. Similarly, the inputs in group B and C are delayed by a full clock period and one and a half clock periods, respectively, so that they nominally have one fourth a clock period of setup time to the middle N/2 tap signals TAP[2:5] and the upper tap signals TAP[6:7]. Also, the inputs in group B nominally have a hold time of one fourth a clock period from tap signals TAP[2:5], while the inputs in group C nominally have a hold time of one half a clock period from tap signals TAP[6:7].

The shaded areas shown in the waveforms in FIG. 3 designate the approximate sampling points of the tap signals from the SDL 110. As discussed above, in each case, healthy set-up and hold times for the tap signals surround the shaded areas.

Figure 4:
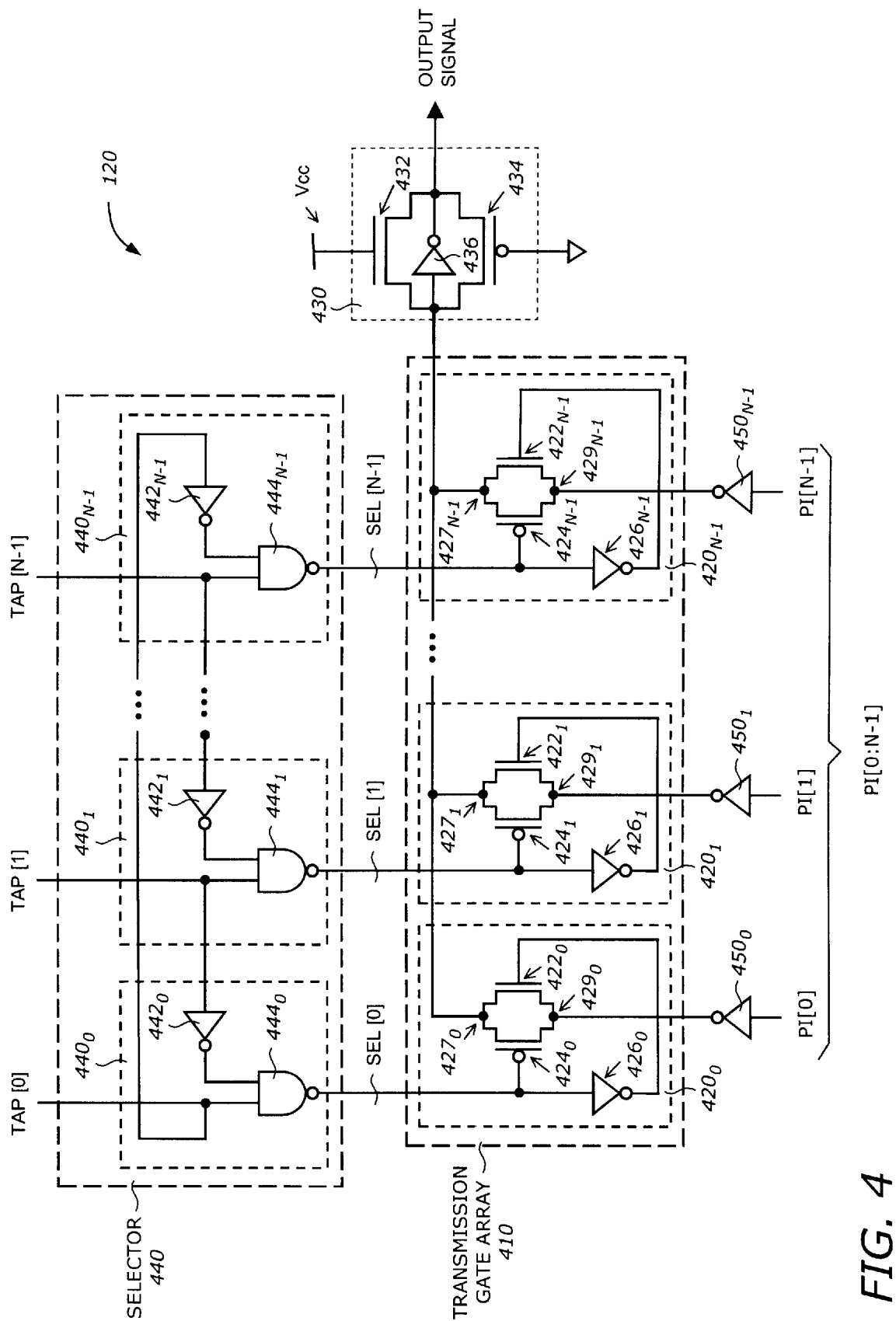
FIG. 4 is a diagram illustrating a digital-to-time domain converter shown in FIG. 1 according to one embodiment of the invention.

FIG. 4 is a diagram illustrating the digital-to-time domain converter (DTC) 120 shown in FIG. 1 according to one embodiment of the invention. The DTC 120 includes a transmission gate array 410, an amplifier circuit 430, and a selector 440.

The transmission gate array 410 receives the pattern input PI[0:N−1] from the pattern data unit 130 (FIG. 1) to transfer one of the N pattern inputs to the circuit output based on an active signal from N select signals SEL[0:N−1] provided by the selector 440. The transmission gate array 410 includes N transmission gates 420$_0$ to 420$_{N-1}$. Each of the N transmission gates 420$_0$ to 420$_{N-1}$ has an output. The N outputs of the N transmission gates 420$_0$ to 420$_{N-1}$ are connected together to form the circuit output. The connected N outputs have an equivalent output capacitance.

The transmission gate 420$_j$ of N transmission gates 420$_0$ to 420$_{N-1}$ includes an n-device 422$_j$, a p-device 424$_j$, and an inverter 426$_j$. The n-device 422$_j$ and the p-device 424$_j$ are n-channel Metal Oxide Semiconductor (NMOS) and p-channel Metal Oxide Semiconductor (PMOS) transistors, respectively. They are connected together at terminals 427$_j$ and 429$_j$. The terminals 427$_j$ of all the transmission gates 420$_0$ to 420$_{N-1}$ (j=0, . . . , N−1) are connected together to provide the circuit output. The terminal 429$_j$ is connected to pattern input PI[j] through inverter 450$_j$. The p-device 424$_j$ has a gate controlled by select signal SEL[j]. The inverter 426$_j$ is connected between the gates of the p-device 424$_j$ and the n-device 422$_j$ so that when p-device 424$_j$ is turned on, the n-device 422$_j$ is also turned on, forming a connection between the terminals 427$_j$ and 429$_j$. Similarly, when the p-device 424$_j$ is turned off by the controlling select signal SEL[j], the n-device 422$_j$ is also turned off, isolating the terminal 427$_j$ from the terminal 429$_j$. The use of both the n-device and p-device as transmission gate provides a full voltage swing from ground up to the $V_{CC}$ supply voltage level.

The amplifier circuit 430 has a gain and is connected to the N transmission gates 420$_0$ to 420$_{N-1}$ at the circuit output to reduce the output capacitance by an amount approximately equal to the gain. The amplifier circuit 430 generates the output signal of the DTC 120. The amplifier circuit 430 includes an n-device 432, a p-device 434, and an inverter 436. The inverter 436 is connected to the circuit output to generate the output signal. The n-device 432 and the p-device 434 are connected together to form a feedback transmission gate. This feedback transmission gate is coupled across the inverter 436 to provide a feedback resistance. The n-device 432 and the p-device 434 are set in the on state, e.g., the gate of the n-device 432 is connected to the supply voltage $V_{CC}$ and the gate of the p-device 434 is connected to ground.

The selector 440 generates the N select signals SEL[0:N−1] based on the N tap signals TAP[0:N−1] from the synchronous delay line 110 (FIG. 1). The selector 440 includes N logic circuits 440$_0$ to 440$_{N-1}$ connected in cascade to generate at most one active signal of the N select signals SEL[0:N−1]. In other words, the selector 440 activates at most one of the N select signals SEL[0:N−1] at a time. Each of the logic circuits 440$_j$ includes an inverter 442$_j$ and a NAND gate 444$_j$. The input to the inverter 442$_j$ is connected to the tap signal TAP[j+1]. The input to the last inverter 442$_{N-1}$ is connected to the tap signal TAP[0]. Referring to the waveforms of the tap signals shown in FIG. 2, when a tap signal TAP[j] goes high, the next tap signal TAP[j+1] remains low for a period equal to $T_P/N$. This fact together with the manner in which the N logic circuits 440$_0$ to 440$_{N-1}$ are connected allows at most only one select signal to be active during any $T_P/N$ time period.

When a tap signal TAP[j] goes high, the corresponding select signal SEL[j] goes low, turning on or activating the transmission gate 420$_j$. During this time, the other select signals are high, turning off the other transmission gates. Therefore, only input bit PI[j] of the pattern inputs PI[0:N−1] is selected to be transferred to the circuit output which is inverted by the inverter 436 to become the synthesized output signal. Since only one transmission gate in the transmission array 410 is turned on or activated at a time, only one pattern input bit is selected at a time.

Figure 5A:
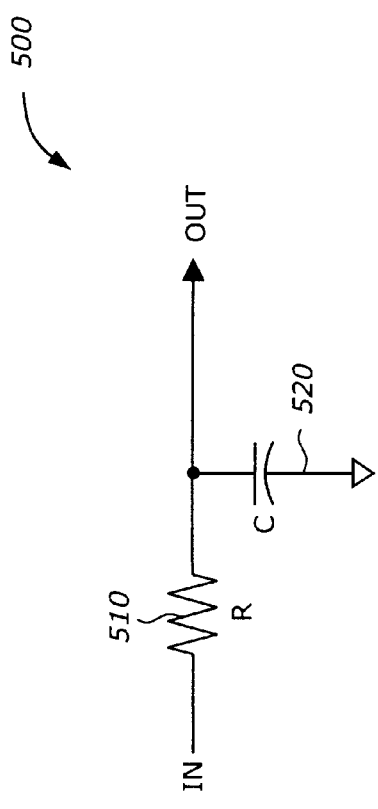
FIG. 5A is a diagram illustrating an equivalent circuit at the DTC without the amplifier circuit used in one embodiment of the invention.

The amplifier circuit 430 can reduce the output capacitance by an amount approximately equal to the gain provided by the inverter 436. Since the frequency of the output signal depends on the output capacitance, a reduction of output capacitance leads to an increased operational frequency. An analysis based on equivalent circuits for the DTC 120 without and with the amplifier circuit 430 can be used to show how the amplifier circuit 430 can reduce the output capacitance FIG. 5A is a diagram illustrating an equivalent circuit 500 at the DTC without the amplifier circuit used in one embodiment of the invention. The equivalent circuit 500 includes a resistor 510 and a capacitor 520.

The resistor 510 has a resistance R which represents the combined series resistance of transmission gate 420$_j$ (FIG. 4) on the activated pattern input bit PI[j] and the internal resistance of the input inverter 450$_j$. The activated pattern input bit PI[j] is the bit that corresponds to the last SDL tap signal that has gone high. All other bits are de-activated at that time. The output of input inverter 450$_j$ is connected either to the power supply $V_{CC}$ or to ground Vss, depending on the logic level at its input.

Note that the signal IN as shown in FIG. 5A corresponds not to the input to the DTC 120 (FIG. 1), but, rather, to the supply to which the inverter 450$_j$ connects the activated transmission gate 420$_j$.

The capacitor 520 has a capacitance C which is the combined parasitic capacitance of all the transmission gates 420$_0$ to 420$_{N-1}$ in the DTC 120. This parasitic capacitance consists of the portion of the gate capacitance between the source/drain nodes connected to the circuit output and the gates of the devices, combined with the diffusion capacitances of the source/drain nodes connected to the circuit output and with the interconnect capacitance on the circuit output.

The resistor 510 and the capacitor 520 form a low pass filter on the input. This low pass filter has a transition time T proportional to the time constant RC of the filter. The larger the number of transmission gates 420$_0$ to 420$_{N-1}$ in the DTC 120, the larger the equivalent capacitance C, and therefore, the larger the transition time T.

The transfer function of the equivalent circuit 500 is the transfer function of a simple one-pole low pass filter as given below:

$$\frac{V_{out}(s)}{V_{in}(s)} = \frac{1}{1+sRC} \quad (2)$$

Figure 5B:
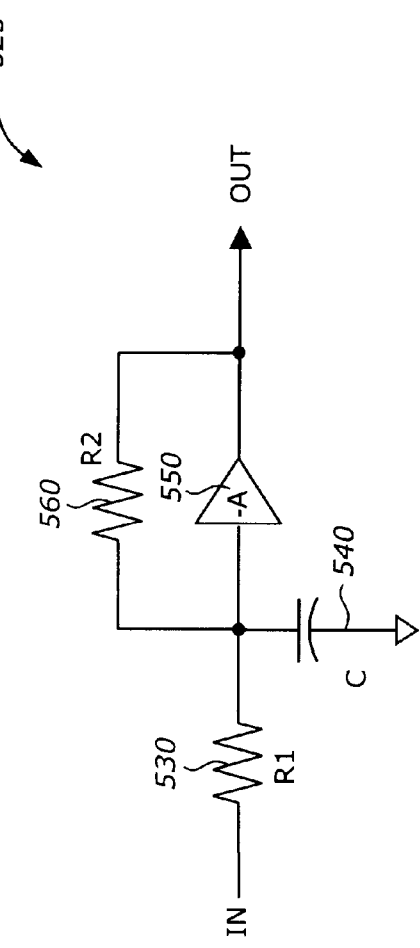
FIG. 5B is a diagram illustrating an equivalent circuit at the DTC with the amplifier circuit according to one embodiment of the invention.

FIG. 5B is a diagram illustrating an equivalent circuit 525 of the DTC with the amplifier circuit 430 according to one embodiment of the invention. The equivalent circuit 525 includes a resistor 530, a capacitor 540, an amplifier 550, and a feedback resistor 560.

The resistor 530 has a resistance R1 and represents the combined series resistance of the activated transmission gate and the corresponding inverter driving the transmission gate. The resistor 530 corresponds to the resistor 510 in FIG. 5A. The capacitor 540 is equivalent to the capacitor 520 in FIG. 5A and has a capacitance C. The amplifier 550 provides a negative gain −A. The feedback resistor 560 has a resistance R2.

The transfer function of the equivalent circuit 525 is given by:

$$\frac{V_{out}(s)}{V_{in}(s)} = \frac{-T}{\left(1+\frac{(1+T)}{A}\right)\left(1+\frac{sR_2\left(\frac{C}{A}\right)}{1+\left(\frac{1+T}{A}\right)}\right)} \quad (3)$$

where $T = \frac{R_2}{R_1}$

Equation (3) may be simplified by assuming that R1≅R2=R and A>>1. The simplified transfer function becomes:

$$\frac{V_{out}(s)}{V_{in}(s)} = \frac{-1}{1+\frac{sRC}{A}} \quad (4)$$

Comparing equation (4) and equation (2) shows that in the equivalent circuit 525 the effective capacitance on the output signal is lower by a factor of A, the amplifier gain, than that of the equivalent circuit 500. Therefore, the effective bandwidth of the DTC with the amplifier circuit 430 is approximately A times wider that that of the DTC without the amplifier circuit. By using the amplifier circuit 430, it is possible to synthesize waveforms having significantly higher frequencies than waveforms synthesized by prior art DTC without the amplifier circuit.

The negative sign for the gain A is due to the inversion caused by the amplifier, which has a negative gain. This inversion can be negated either by adding an inverter after the DTC or by inverting the pattern input PI[0:N−1] to the DTC.

The amplifier 550 corresponds to the inverter 436 shown in FIG. 4. The feedback resistor 560 corresponds to the feedback transmission gate formed by the n-device 432 and the p-device 434 in the amplifier circuit 430 shown in FIG. 4.

In practice, the gain A of the amplifier is generally on the order of 5 to 10. Therefore, the assumption A>>1 may not be completely accurate. Nonetheless, the output capacitance is significantly lowered using this technique. The output swing may not be over the full 0-to-$V_{CC}$ range due to this rather low value of A. However, connecting a simple logic gate, such as another inverter, at the output of the DTC readily restores the output swing to the full 0-to-$V_{CC}$ range. The resistances R1 and R2 may be adjusted by varying the sizes of the transmission gates in the transmission gate array 410 and the feedback transmission gates 432 and 434 in FIG. 4.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
    N transmission gates having N outputs to transfer one of N pattern inputs to a first output based on an active signal from N select signals, the N outputs being connected together to form the first output and having an output capacitance; and
    an amplifier circuit having a gain and coupled to the N transmission gates at the first output to reduce the output capacitance by an amount approximately equal to the gain, the amplifier circuit generating an output signal.

2. The apparatus of claim 1 wherein each of the N transmission gates comprises:

a first device and a second device coupled together at first and second terminals to provide the first output at the first terminal and to receive each of the N pattern inputs at the second terminal, the first and second devices having first and second gates, respectively, the first gate being controlled by one of the N select signals.

3. The apparatus of claim 2 wherein each of the N transmission gates further comprises:

an inverter connected between the first and second gates to turn on the second device when the first device is turned on by the one of the N select signals.

4. The apparatus of claim 3 wherein the inverter turns off the second device when the first device is turned off by the one of the N select signals.

5. The apparatus of claim 2 wherein the first and second devices are p-type and n-type devices, respectively.

6. The apparatus of claim 1 wherein at most one of the N select signals is active at a time.

7. The apparatus of claim 6 wherein at most one of the N select signals is active for a period equal to $T_P/N$, $T_P$ being a reference clock period.

8. The apparatus of claim 1 wherein the amplifier circuit comprises:

an inverter coupled to the first output to generate the output signal; and a feedback transmission gate coupled across the inverter to provide a feedback resistance.

9. The apparatus of claim 8 wherein the feedback transmission gate comprises:

an n-type device and a p-type device connected together to form a feedback resistor having a feedback resistance, each of the n-type and p-type devices being in the on state.

10. The apparatus of claim 1 further comprising:

a selector to generate the N select signals based on N tap signals from a synchronous delay line.

11. The apparatus of claim 10 wherein the selector comprises:

N logic circuits connected in cascade to generate at most one active signal of the N select signals.

12. A method comprising:

transferring one of N pattern inputs to a first output based on an active signal from N select signals using N transmission gates having N outputs, the N outputs being connected together to form the first output and having an output capacitance; and reducing the output capacitance by an amount approximately equal to a gain using an amplifier circuit having the gain, the amplifier circuit generating an output signal.

13. The method of claim 12 wherein transferring comprises:

providing the first output at the first terminal; and receiving each of the N pattern inputs at the second terminal by a first device and a second device, the first and second devices having first and second gates, respectively, the first gate being controlled by one of the N select signals.

14. The method of claim 13 wherein transferring further comprises:

turning on the second device when the first device is turned on by the one of the N select signals using an inverter connected between the first and second gates.

15. The method of claim 14 wherein transferring further comprises:

turning off the second device when the first device is turned off by the one of the N select signals using the inverter.

16. The method of claim 13 wherein receiving by the first device and the second device comprises receiving by p-type and n-type devices, respectively.

17. The method of claim 12 wherein transferring comprises activating at most one of the N select signals at a time.

18. The method of claim 17 wherein activating at most one of the N select signals comprises activity at most one of the N select signals for a period equal to $T_P/N$, $T_P$ being a reference clock period.

19. The method of claim 12 wherein reducing the output capacitance comprises:

generating the output signal; and providing a feedback resistance by a feedback transmission gate.

20. The method of claim 19 wherein providing the feedback resistance comprises:

forming a feedback resistor having the feedback resistance by an n-type device and a p-type device connected together, each of the n-type and p-type devices being in the on state.

21. The method of claim 12 further comprising:

generating the N select signals based on N tap signals from a synchronous delay line by a selector.

22. The method of claim 21 wherein generating comprises:

generating at most one active signal of the N select signals by N logic circuits connected in cascade.

23. A circuit comprising:

a synchronous delay line to generate N tap signals in response to a reference signal;

a pattern generator to generate N pattern inputs; and a digital-to-time domain converter (DTC) coupled to the synchronous delay line and the pattern generator to generate an output signal from the N tap signals, the output signal being synchronized by the N pattern inputs, the DTC comprising:

N transmission gates having N outputs to transfer one of the N pattern inputs to a first output based on an active signal from N select signals, the N outputs being connected together to form the first output and having an output capacitance, and an amplifier circuit having a gain and coupled to the N transmission gates at the first output to reduce the output capacitance by an amount approximately equal to the gain, the amplifier circuit generating an output signal.

24. The system of claim 23 wherein each of the N transmission gates comprises:

a first device and a second device coupled together at first and second terminals to provide the first output at the first terminal and to receive each of the N pattern inputs at the second terminal, the first and second devices having first and second gates, respectively, the first gate being controlled by one of the N select signals.

25. The system of claim 24 wherein each of the N transmission gates further comprises:

an inverter connected between the first and second gates to turn on the second device when the first device is turned on by the one of the N select signals.

26. The system of claim 25 wherein the inverter turns off the second device when the first device is turned off by the one of the N select signals.

27. The system of claim 24 wherein the first and second devices are p-type and n-type devices, respectively.

28. The system of claim 23 wherein at most one of the N select signals is active at a time.

29. The system of claim 28 wherein the at most one of the N select signals is active for a period equal to $T_P/N$, $T_P$ being a reference clock period.

30. The system of claim 23 wherein the amplifier circuit comprises:

an inverter coupled to the first output to generate the output signal; and a feedback transmission gate coupled across the inverter to provide a feedback resistance.

31. The system of claim 30 wherein the feedback transmission gate comprises:

an n-type device and a p-type device connected together to form a feedback resistor having the feedback resistance, each of the n-type and p-type devices being in the on state.

32. The system of claim 23 wherein the DTC further comprises:

a selector to generate the N select signals based on the N tap signals from the synchronous delay line.

33. The system of claim 32 wherein the selector comprises:

N logic circuits connected in cascade to generate at most one active signal of the N select signals.

* * * * *